United States Patent [19]
Lemelson

[11] Patent Number: 5,529,815
[45] Date of Patent: Jun. 25, 1996

[54] APPARATUS AND METHOD FOR FORMING DIAMOND COATING

[76] Inventor: Jerome H. Lemelson, Suite 286, Unit 802, 930 Tahoe Blvd., Incline Village, Nev. 89451-9436

[21] Appl. No.: 333,795

[22] Filed: Nov. 3, 1994

[51] Int. Cl.$^6$ .............................. B05D 3/06; C23C 14/28
[52] U.S. Cl. ................ 427/575; 427/577; 427/596; 427/249; 423/446; 118/720; 118/733
[58] Field of Search ..................... 427/249, 575, 427/577, 596; 118/720, 733; 423/446

[56] References Cited

FOREIGN PATENT DOCUMENTS 53-17583  2/1978  Japan ....................... 118/733

*Primary Examiner*—Roy V. King
*Attorney, Agent, or Firm*—J. Kevin Parker

[57] ABSTRACT

A method for forming synthetic diamond coatings on surfaces, such as select surfaces of boat hulls, motor vehicle underbodies, chemical storage tanks and the like, which are subject to corrosion and/or erosion. In a preferred form, the apparatus is portable and is either hand-holdable or is carried by a self propelled vehicle or computer controlled automatic manipulator. In a particular form, the apparatus includes a chamber having an opening therein with a circumscribing rim adapted to be forced against a portion of the surface to be coated while one or more carbon atom, containing materials in gaseous and/or solid particle form are fed to the surface interior of such rin and form a synthetic diamond coating or the like thereagainst. Radiation directed through such chamber from a microwave generator and/or a plasma generator, is directed against such surface portion and the carbon containing material and operates to form same into synthetic diamond or diamond-like coating which becomes bonded to the surface while the housing defining the chamber is held stationery or is controllably moved across the surface by hand or by a manipulator holding such housing.

17 Claims, 2 Drawing Sheets

APPARATUS AND METHOD FOR FORMING DIAMOND COATING

BACKGROUND AND SUMMARY OF THE INVENTION

Diamond and related types of coatings are typically applied by disposing the substrate to be coated within a reaction chamber and then initiating the chemical or physical reaction that results in the deposition of coating material on the substrate. Containment of a large substrate in a reaction chamber, however, requires a large and expensive structure.

The present invention relates to an apparatus and method for coating articles of manufacture, vehicle bodies, boat hulls, and other large stuctures with diamond and diamond-like materials and the like which are formed in situ on all or select portions of the surfaces of such articles or structures. A portable reaction apparatus is employed which is positioned to engage a select portion of the surface being coated and to coat the surface interior of an opening to a reaction zone or chamber. In one form, the portable coating apparatus is hand held and is selectively disposed or forced into engagement with the surface to be coated. In another form, it is supported by an automatic manipulator or arm assembly which is computer controlled in its operation to predeterminately position the coating apparatus against the work and operate the coating means thereof to coat just one select portion of the surface or a plurality of select surface portions which may be either a continuous extension of the originally coated portion or separated by spaces to form discrete are as of coating. The coating apparatus is thus relatively small in size and may be employed to coat relatively large areas by step applying the coating material area-by-area each time the portable device is held stationary against or above the article or structure and/or by slideably engaging the surface being coated with the coating apparatus and moving it in sliding movement across such surface while applying and forming coating materials into coatings using one or more forms of radiation to form and bond the coating material to the substrate.

In a preferred form, the portable coating tool has an opening to a reaction chamber and an external rim surrounding such opening for engaging a surface of an article or assembly and effecting a fluid pressure seal therewith. Coating material is thus prevented from escaping or flowing across the seal during the coating operation. The reaction chamber may be automatically evacuated of air or held at ambient or an increased air pressure during the coating operation. Heat is generated by radio frequency, microwave, plasma, laser or other means while coating material or precursor material is introduced into the volume between the surface to coated and the internal reaction zone to cause such material to release carbon atoms to the surface and to form a synthetic diamond or diamond-like coating thereon. The entire coating operation, including the operation of a manipulator arm assembly upon which is mounted the coating apparatus, may be computer controlled.

It is therefore a primary object of the present invention to provide a new and improved apparatus and method for applying coatings of hard, wear and corrosion resistant materials, such as synthetic diamond and diamond-like material, to the surfaces of articles of manufacture that are not readily coatable with conventional coating apparatus.

It is a further object to provide a hand-held coating apparatus which may be selectively positioned to coat select areas of an object.

It is a further object to provide a coating apparatus mounted upon a manipulator arm assembly which may be selectively positioned to coat select areas of an object under computer control.

It is a further object to provide a computer controlled coating apparatus operated in accordance with feedback signals generated by sensing means which sense one or more process variables relating to the coating operation.

Other objects, features, and advantages of the invention will become evident in light of the following detailed description considered in conjunction with the referenced drawings of a preferred exemplary embodiment according to the present invention.

DETAILED DESCRIPTION OF THE INVENTION

Figure 1:
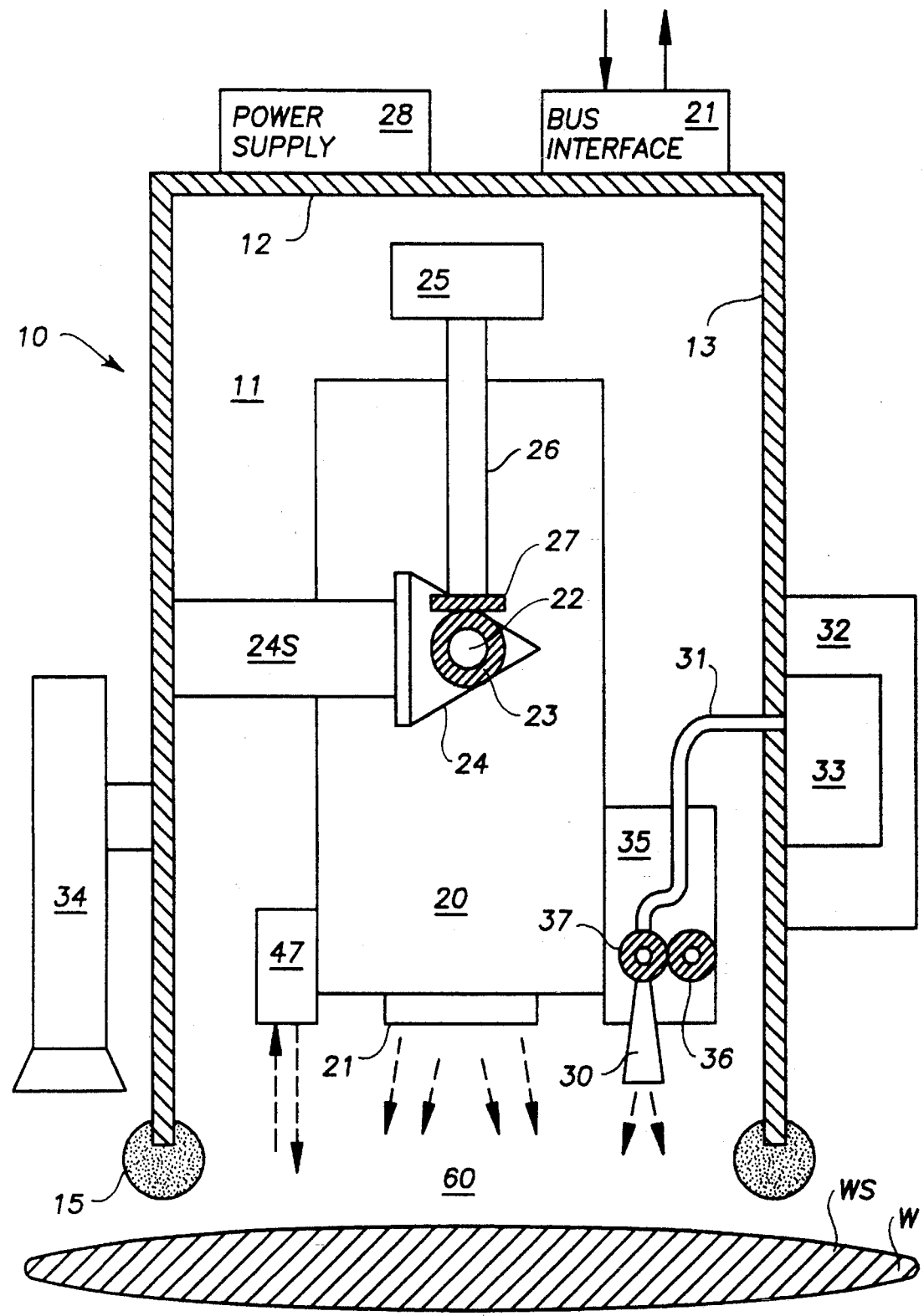
FIG. 1 depicts schematically a partially sectioned view of the coating apparatus.

In FIG. 1 is shown an apparatus 10 for coating various surfaces with synthetic diamond or diamond-like material. Such surfaces as the external surfaces of boat hulls subject to salt water corrosion and the formation of barnacles, propellers, flight surfaces of aircraft subject to frictional drag and heating, and the undersides of motor vehicles subject to rust may be completely coated with carbon forms as films or thin layers of synthetic diamond or diamond-like material such as carbon-nitride. A housing 11 defining a reaction chamber is formed of sheet metal, or a casting such as stainless steel or other high-temperature resistant metal alloy or ceramic material, and contains an upper end wall 12, a circumscribing side wall 13, and at its lower end wall a central opening 16 to the interior volume of the chamber.

Secured withing the housing 11 by a bracket 24 is a subhousing 20 containing either a radiation source, such as a microwave generator or laser, or a plasma generator. A nozzle 21 is provided for directing a plasma either alone or in combination with a beam of radiation through the opening 16 against a select portion of the surface WS of a workpiece W disposed inwardly of the opening 16. Circumscribing the opening 16 is a circular deformable flange or rim 15 which may be compressed against the surface WS of work W to effect a static or dymanic seal thereagainst to prevent the escape of coating material from the reaction chamber. The rim 15 may contain or be defined by a deformable metal, ceramic, or composite plastic-ceramic O-ring secured thereto to effect such static or dynamic sliding seal.

A power supply 28 is shown secured to the rear wall 12 of housing 11 and may be battery or line current operated to provide electrical energy for power operating the microwave beam generator, laser or other form of radiation generator in subhousing 20 which directs radiation either alone or in combination with a plasma arc against either the entire area of the surface WS of work W exposed via the opening 16 or a select portion thereof. Subhousing 20 is shown pivotally mounted on a shaft 22 secured to a V-shaped bracket 24 which is secured to the side wall 13 of housing 11 and is power pivoted to scan about the axis of shaft 22 by an electric gear motor 25, the output shaft 26 of which is coupled to shaft 22 via a gear train defined by gears 23 and 27 connected to shafts 22 and 26. A vacuum pump 29 operated by a motor 29M evacuated air from housing 11 preferably under control of the computer 15.

Electrical energy from power supply 28 or an external source is supplied via a power bus (not shown) within the structure of housing 11 and extending to subhousing 20 to power the radiation generator therein and/or the plasma generator for generating the plasma arc or jet. In other embodiments, subhousing 20 may also be mounted externally of housing 11 or may be separated from the reaction zone adjacent the opening 16 by a partition which may be insulated and/or air or water cooled.

Supported exterior of housing 11 is a second subhousing 32 containing a reservoir 32 of carbon particles, such as carbon fullerenes, hydrocarbon gas such as methane, or other material (which may be in vaporous form) to be deposited on the exposed area of surface WS. A pump 33 (driven by an electric gear motor 34 coupled thereto) is provided for controllably supplying such carbon atom material in reservoir 32 as a flow through a flexible hose 31 extending to a duct or nozzle 30 supported by subhousing 20. To permit nozzle 30 to scan and distribute carbon particles to the exposed area of surface WS, the output shaft 36 of a third reversible gear-motor 35 mounted on the side wall 13 of subhousing 20 is coupled via a gear train 37 to power pivot nozzle 30 about an axis defined by a bracket 38 secured to subhousing 20.

While housing 11 and devices secured thereto may be manually positioned and held against the work W as shown, it is preferably supported by an automatic or manually controlled manipulator 50 the operating head 51 of which is shown secured to sidewall thereof. Housing 11 may also be supported on a wheeled or articulated leg with a travelling motorized vehicle operable to carry the housing across a surface of the substrate W, which vehicle may in one embodiment be held magnetically against the substrate surface. A microcomputer 15 is programmed to control the operation of the motors driving manipulator 50, reversible gear motors 25 and 35, and pump motor 34 as well as controls for the power supply 28 and the radiation and plasma arc generator in subhousing 20. The manipulator 50 is operated to cause housing 11 to either be stepped in position and/or slidably moved along a select path across the surface of the substrate or workpiece W to properly form and coat synthetic diamond or diamond-like material of a select thickness on a select portion of its surface or surfaces.

The apparatus is operated as described to form, via chemical vapor deposition of carbon and/or other elements, high wear and corrosion resistant coatings on the surface of the substrate, such as a boat hull, vehicle body, architectural structure, or the interior or exterior surface of a container, tank, duct or pipe. In the event that the coating process requires the use of hydrogen and/or oxygen or other elements or compounds mixed with or sequentially fed to the carbon atom containing gas, vapor or solid particles applied to the reaction zone, such additional material may be controllably fed from respective supplies thereof by respective conveyances or pumps operated by respective computer controlled gear motors or may be mixed with the carbon atom containing medium and conrollably fed therewith from a a single reservoir or from a separate reservoir of such additional precursors or catalysts. Also it is noted that the surface WS may be sequentially coated with different materials as described above under computer control, such as carbon and carbon-nitrogen compounds defining discrete layers of each.

In another embodiment of the present invention, a diamond film is produced from fullerenes. (See *Science*, 265, 609 (1994).) diamond powder is first deposited (such as from a spray nozzle within housing 11) on the surface WS to form a coating of discrete diamond nuclei on the the surface. After evacuation of the reaction chamber 11, vaporized fullerenes and an inert gas such as argon are injected into the chamber and subjected to heat. The heated argon atoms collide with the fullerenes and break them into dimers which bind to the diamond nuclei on the surface WS resulting in a continuous diamond film.

Figure 2:
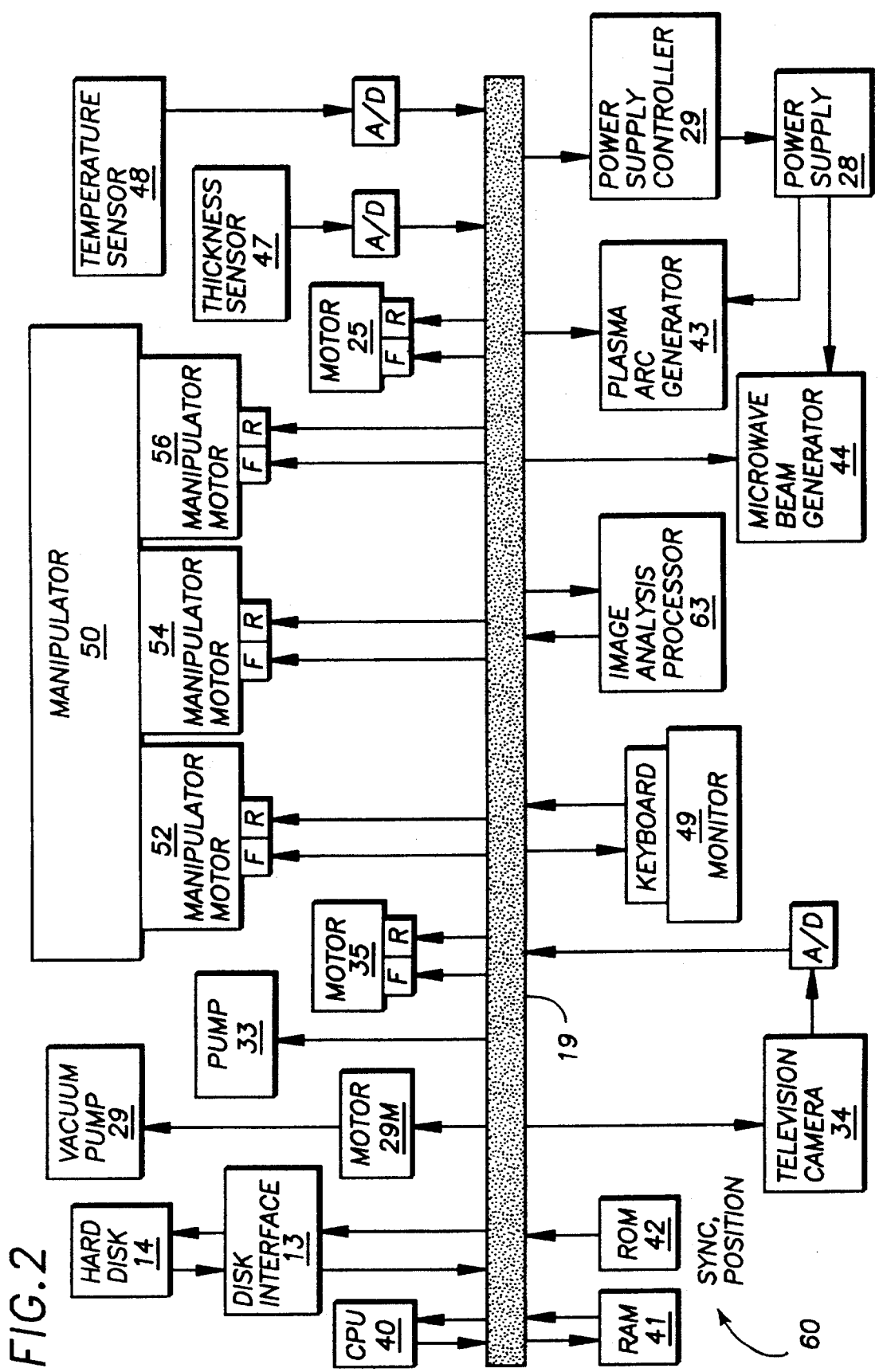
FIG. 2 is a schematic of the computer system used to control the operation of the coating apparatus.

As shown in FIG. 1, a bus interface 21 is provided for connecting the apparatus to a computer 15. The computer control system 15 shown in FIG. 2 includes a CPU or microprocessor 40 which is operable to control both the operation of the manipulator 50 by controlling the operations of the various motors or servos which move the manipulator and the operations of the components of housing 11, such as the vacuum pump motor 29M (if necessary) and the radiation and/or plasma arc-generator and the motor or motors employed to feed carbon atom containing gas, liquid and/or solid particles to the reaction zone after sealing engagement is made with the work or structure to be coated as described. The automatic computer controlled manipulator 50 may be constructed and controlled in its operation in accordance with the teachings of my U.S. Pat. Nos. 3,226,833; 3,260,375; 3,272,347; and Re: 26,904 which are hereby incorporated by reference. The manipulator may comprise a plurality of articulated arm assemblies supported on a stationary ball, a floor traveling carriage or by an overhead movable bridge crane or the like. Reversible electric gear motors 52, 54, and 56 each operate to drive a respective arm assembly in response to control signals received from the computer 60. Such control may be open loop or closed loop derived by utilizing feedback signals indicative of the operations of the motors in response to command control signals generated by the CPU 40 in accordance with a program stored in a memory such as a magnetic disc, tape or microelectronic chip.

The computer 60 includes a bus 19 to which are connected the CPU 40, a random access memory or RAM 41, a read-only memory or ROM 42, a disk 14 with disk interface 13, and a keyboard and monitor 49. Also interfaced to the bus 19 are the coating feedstock pump 33, the motor 25 for effecting scanning movement of the radiation generator 20, the motor 35 for causing the nozzle 30 to scan the surface WS of the substrate W, the motors 52, 54, and 56 for controlling the operation of the manipulator 50, a coating thickness sensor 47, and a temperature sensor 48. The CPU 40 also communicates over bus 19 with a power supply controller 29 for controlling the power supply 28 which provides suitably controlled electrical energy for operating a plasma-arc generator 43 (and its feedstock), a microwave; generator 44, and vacuum pump motor controller 29C.

In order to control the operation of the coating apparatus in closed-loop fashion, computer 60 receives data relating to the coating operation in the form of signals from temperature sensor 48, which senses the temperature within the reaction chamber, and signals from thickness sensor 47, which senses the thickness of the coating applied to surface WS. Thickness sensor 47 may be an ultrasonic scanner which measures the time in which ultrasonic echoes return from acoustic boundaries (i.e., the surface of the coating and the surface WS) or an instrument employing spectroscopic ellipsometry such as is manufactured by the J. A. Woollam Co. of Lincoln, Neb. The thickness sensor 48 scans the coating as it is formed and generates signals which are digitized and fed to the computer 60 which controls the operation of the coating apparatus in accordance therewith.

As shown in FIG. 1, a television camera 34 is provided for generating image data for use in controlling the coating operation. In some embodiments, the camera 34 may be supplemented by one or more additional cameras or other forms of electro-optical scanners which generate images for analysis. Television camera 34 is mounted on (or within) housing 11 and directed so as to image the area immediately adjacent the portion of surface WS covered by rim 15 of the coating apparatus. This area may, for example, be the surface portion just coated in the case where the coating apparatus is undergoing a scanning movement. The operation of the camera 34 is controlled by the computer 60 sending sync and position signals (which control a motor-operated mounting) over the bus 19. Digitized image signals are produced by camera 34 (or analog video signals are digitized by an analog-to-digital converter) and then transmitted over bus 19 for storage in memory and analysis either by image analysis software executed by the CPU 40 or by a dedicated image analysis processor 63. (One example of such an image analysis system is the Omnimet 4 manufactured by Buehler Ltd. of Lake Bluff, Ill.) The results of the image analysis are then used to control the operation of coating apparatus in a closed-loop manner by providing output codes to the computer 60 for controlling the manipulator 50 by controlling its motors 52, 54, and 56 as well as for controlling the other elements of the apparatus interfaced to bus 19. Depending upon the programming of the computer 60, the image signals generated by camera 34 may be used to: (a) predeterminately position housing 11 with respect to a unit of work for a single coating operation on its entire surface or a select portion thereof, (b) precisely step housing 11 and/or a work handling conveyor or manipulator one or more times and control the coating operation each time to coat an extended area of the work a step at a time, (c) predeterminately operate the manipulator 50 to cause the housing 11 to scan a select portion or portions of the surface of the work and to coat same as described in accordance with the results of the scanning.

Although the invention has been described in conjunction with the foregoing specific embodiment, many alternatives, variations, and modifications will be apparent to those of ordinary skill in the art. Those alternatives, variations, and modifications are intended to fall within the scope of the following appended claims.

What is claimed is:

1. A method for applying a synthetic diamond coating to the surface of a substrate comprising:
    (a) supporting a reaction chamber adjacent to a surface to be coated wherein a rim circumscribing an opening to said chamber is disposed in abutment with a select portion of said surface;
    (b) introducing a select quantity of a carbon atom containing material into said chamber so that at least a portion is disposed adjacent said surface; and
    (c) controllably generating and directing radiation from within said chamber against the carbon atom containing material disposed adjacent said surface at sufficient intensity and for a sufficient period of time to cause atoms of carbon of said carbon atom containing material to form a layer of synthetic diamond material on said select portion of said surface.

2. A method in accordance with claim 1 wherein said reaction chamber is automatically evacuated after performing step (a).

3. A method in accordance with claim 1 wherein said rim circumscribing said opening to said chamber is disposed in sealing abutment with said select portion of said surface.

4. A method in accordance with claim 1 wherein said radiation is laser radiation.

5. A method in accordance with claim 1 wherein said radiation is microwave radiation.

6. A method in accordance with claim 1 wherein a plasma is generated and injected into said chamber to define at least a portion of said radiation.

7. A method in accordance with claim 1 wherein steps (a) through (c) are performed while said reaction chamber is held stationary and wherein said chamber is intermittently moved to expose new portions of said surface to the opening in said chamber, and further wherein steps (a) through (c) are repeated in order to coat a new portion of said surface with said synthetic diamond.

8. A method in accordance with claim 7 wherein said new portions of said surface are contiguous with one another so as to provide a continuous coating.

9. A method in accordance with claim 7 wherein said new portions of said surface overlap with one another so as to provide a continuous coating.

10. A method in accordance with claim 7 wherein said reaction chamber is held by hand against said surface.

11. A method in accordance with claim 7 wherein said reaction chamber is attached to an automatic manipulator arm which moves said reaction chamber along said surface.

12. A method in accordance with claim 7 wherein said reaction chamber is attached to a self-propelled vehicle which moves said reaction chamber along said surface.

13. A method in accordance with claim 11 wherein a computer controls the performance of steps (a) through (c) and the operation of said automatic manipulator arm in a manner so as to step said reaction chamber across said surface in discrete increments of predetermined length.

14. A method in accordance with claim 11 wherein a computer controls the performance of steps (a) through (c) and the operation of said automatic manipulator arm in a manner so as to slide said reaction chamber continuously across said surface.

15. A method in accordance with claim 12 wherein said vehicle is held magnetically against said surface as it moves said reaction chamber along said surface.

16. A method in accordance with claim 12 wherein said vehicle is computer controlled to effect said coating as it moves by forming a diamond coating on select portions of said surface.

17. A method in accordance with claim 11 wherein said reaction chamber is automatically evacuated of air after performing step (a).

* * * * *